United States Patent [19]

Isbell et al.

[11] Patent Number: 4,743,783
[45] Date of Patent: May 10, 1988

[54] PULSE WIDTH MODULATOR CIRCUIT FOR SWITCHING REGULATORS

[75] Inventors: Tim D. Isbell, San Jose; Walter R. Davis, Sunnyvale, both of Calif.

[73] Assignee: National Semiconductor Corporation, Santa Clara, Calif.

[21] Appl. No.: 1,321

[22] Filed: Aug. 25, 1986

Related U.S. Application Data

[62] Division of Ser. No. 571,274, Jan. 16, 1984, Pat. No. 4,634,892.

[51] Int. Cl.[4] .................. H03K 5/22; H03B 19/00; H03F 3/45
[52] U.S. Cl. .................................. 307/498; 307/529; 307/494; 307/357; 330/260
[58] Field of Search ............... 307/498, 494, 529, 261, 307/355, 356, 357, 362, 364; 328/159, 158; 330/69, 252, 300, 260

[56] References Cited

U.S. PATENT DOCUMENTS

| | | | |
|---|---|---|---|
| 3,259,758 | 7/1966 | Hobrough | 307/498 |
| 3,764,826 | 10/1973 | Okada | 307/357 |
| 3,935,507 | 1/1976 | Wölber | 330/69 |
| 4,057,796 | 11/1977 | Hoogendoorn et al. | 307/260 |
| 4,599,572 | 7/1986 | Nakayama | 307/498 |

Primary Examiner—Stanley D. Miller
Assistant Examiner—Timothy P. Callahan
Attorney, Agent, or Firm—Gail W. Woodward

[57] ABSTRACT

A circuit for pulse width modulating the output of a voltage controlled oscillator without introducing any ocilator frequency or amplitude (slope) modulation. A summing circuit is combined with a comparator and provided with inputs that accommodate differential sum/difference inputs, an error input and a ramp input from the oscillator or other source. The ramp and error signals are combined differentially to pulse width modulate the comparator output and pulse width modulation can also be achieved by via the sum/difference inputs a differential relationship.

2 Claims, 2 Drawing Sheets

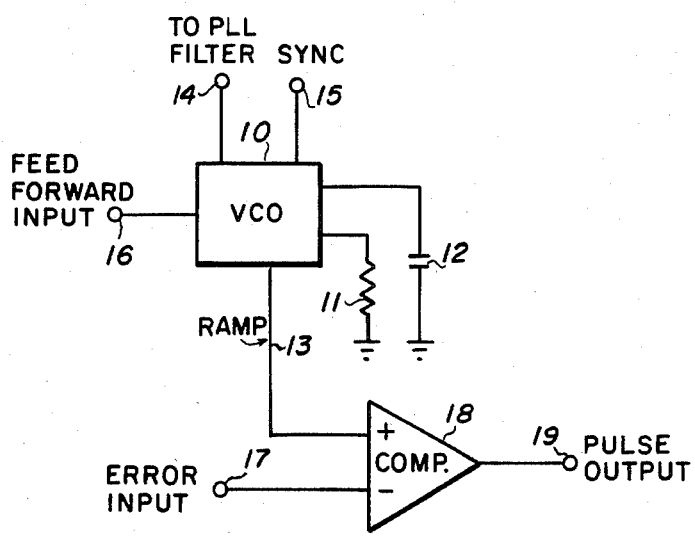
Fig_1 (PRIOR ART)
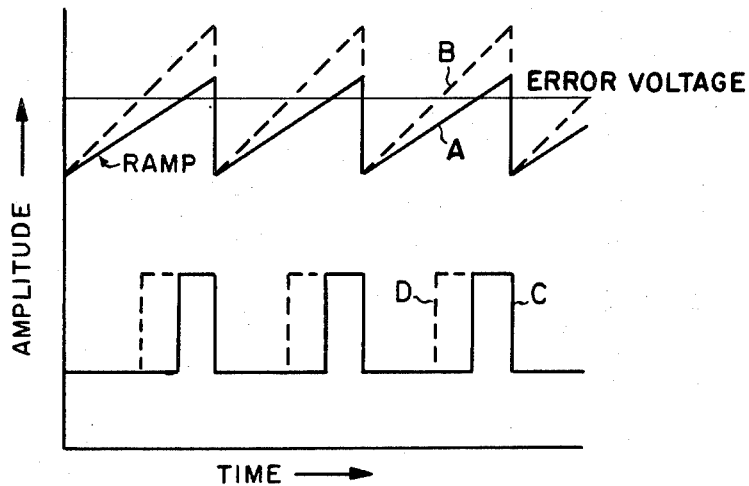
Fig_2 (PRIOR ART)
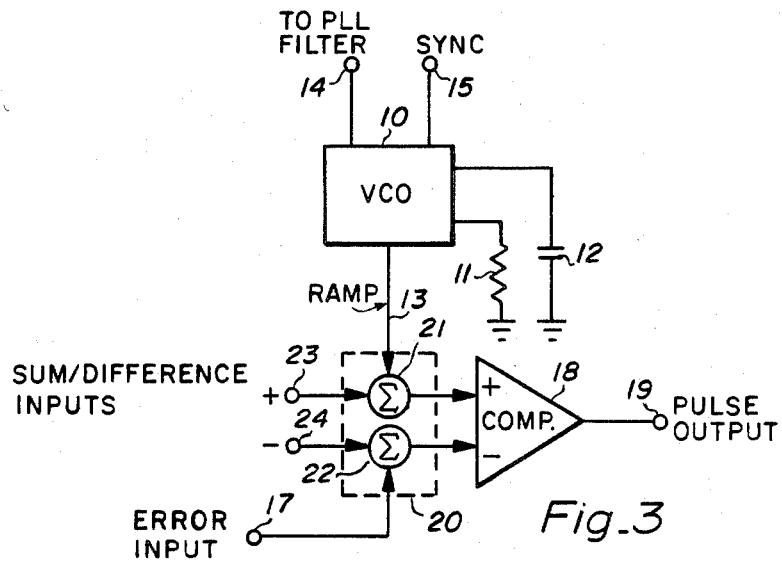
Fig_3

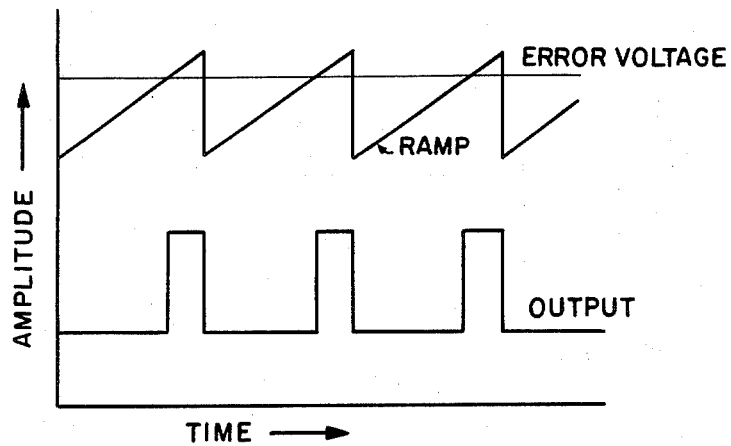
Fig_4
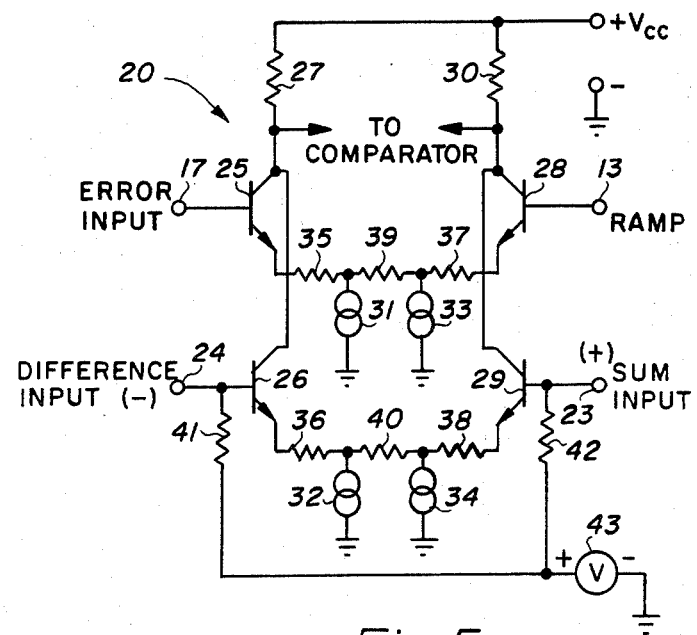
Fig_5

PULSE WIDTH MODULATOR CIRCUIT FOR SWITCHING REGULATORS

This is a division of application Ser. No. 571,274 filed on Jan. 16, 1984 now U.S. Pat. No. 4,634,892.

BACKGROUND OF THE INVENTION

The invention relates to the switching regulator art in which a switch duty cycle controls the energy transfer in a power supply. The fundamental operation of such devices is set forth in a paper titled Scaling Down PWM Chip Suits Low-Power Switchers in the July 8, 1982, issue of Electronic Design, pages 175–179. This paper sets forth the fundamental details of buck, boost, and flyback power supply circuits. Another paper in the same issue of Electronic Design, on pages 69–80, is titled Power-Supply ICs Gain in Function, Programmability and shows how FET switches are employed.

SUMMARY OF THE INVENTION

It is an object of the invention to provide a pulse width modulator in which a ramp signal, generated in a voltage controlled oscillator, is compared with an error voltage to produce a pulse having a frequency equal to that of the oscillator and a duty cycle determined by the comparison.

It is a further object of the invention to develop a "constant slope" ramp signal which is compared with an error voltage to develop a pulse having a modulated duty cycle.

It is a still further object of the invention to modulate the width of a pulse in response to a sum/difference control voltage wherein a constant slope ramp voltage supplied by a voltage controlled oscillator is compared with an error voltage to develop a pulse width modulated output pulse.

These and other objects are achieved as follows. A Voltage-Controlled Oscillator (VCO), which can be made a part of a Phase-Locked Loop (PLL), is configured to produce an output ramp that is applied to a summing circuit. The summing circuit is also provided with an error voltage input and differential sum/difference inputs. The summing circuit in turn feeds the input to a comparator which has a Pulse Width Modulation (PWM) output. The PWM output is duty cycle related to the error voltage and the sum/difference voltages. This means that the ramp voltage can be made to have a constant slope so the VCO performance is related only to its frequency determining elements.

In a preferred embodiment the summing circuit comprises a pair of differentially operated current combiners. The input terminals which receive the error, ramp and sum/difference voltages are coupled to voltage controlled constant current devices. The summed currents are sensed by load elements which develop voltages that are fed to a conventional comparator.

The sum/difference inputs can be used to add or subtract from the ramp or error voltage. This is useful in many applications, such as feed forward, current mode feedback (ramp compensation), adaptive start-up, and the like.

BRIEF DESCRIPTION OF THE DRAWING

FIG. 1 is a block diagram of a commonly used prior art PWM circuit.

FIG. 2 is a graph of the waveforms of the FIG. 1 circuit.

FIG. 3 is a block diagram of the circuit of the invention.

FIG. 4 is a graph of the waveforms of the FIG. 3 circuit.

FIG. 5 is a schematic diagram of the summer circuit employed in block 20 of FIG. 3.

DESCRIPTION OF THE PRIOR ART

FIG. 1 is a block diagram of a prior art PWM. A Voltage-Controlled Oscillator (VCO) 10 is provided with a resistor 11 and a capacitor 12. It generates a ramp (or sawtooth) signal output on line 13. The VCO is provided with a pair of voltage sensitive frequency controlling inputs. Terminal 14 is the input normally connected to the filter in a Phase-Locked Loop (PLL) and terminal 15 provides a synchronization input. Thus, while VCO 10 is voltage responsive, its basic frequency is determined by an R-C combination. Another input at terminal 16 provides what is called feed forward input which permits a rapid oscillator amplitude (slope) modulation with an applied voltage. (A feed forward input is used to provide an initial open loop compensation for changes due to input voltage variations.) The sawtooth at line 13 can be amplitude modulated, without any frequency change, as a function of the voltage at terminal 16. Note that the slope is not constant.

The sawtooth on line 13 and an error input voltage at terminal 17 are fed to comparator 18. FIG. 2 shows the waveforms associated with the FIG. 1 circuit. The comparator output, at terminal 19 is waveform C. This is a pulse the width of which will be varied as a function of the error voltage level. Waveform A represents the ramp voltage. As the error voltage rises the pulse width narrows for the circuit shown. Waveform B, shown in dashed outline, shows a higher amplitude or slope ramp. The effect is shown in output waveform D, which is also shown in dashed outline, as a broadening of the output pulse. Thus, the output pulse width can be modulated by both the error voltage and the feed forward voltage. With this system, as the frequency is increased it becomes very difficult to hold the frequency constant as the ramp slope changes because the ramp trip points must change with ramp slope to maintain constant frequency.

In the ideal system the operating frequency is constant and only determined by resistor 11 and capacitor 12 along with the D-C input on terminal 14. Actually whenever a VCO is amplitude modulated, its frequency will tend to shift. This is due in part to the fact that the flyback time cannot be made zero. Furthermore temperature responsive component variations will ordinarily make the oscillator frequency temperature sensitive.

One way to avoid the frequency shift resulting from the feed forward voltage is to split the VCO and ramp generator actions apart and to modulate only the ramp generator with the feed forward voltage. This approach requires a dual matched set of resistor and capacitor components.

Another problem relates to the feed forward sense. Once the system is set up as shown the feed forward modulation of the VCO is in one direction. As shown, increasing the ramp amplitude widens the output pulse (waveform D). If it is desired to invert the feed forward sense an inverting buffer would have to be inserted into line 16.

DESCRIPTION OF THE INVENTION

FIG. 3 is a block diagram of the circuit of the invention. Where the parts function in the same way as those in FIG. 1 the same numbers are employed. FIG. 4 shows the waveforms associated with FIG. 3. The main difference is the inclusion of a summing block 20 at the comparator 18 input. A pair of summers 21 and 22 are incorporated into the comparator inputs and a pair of sum/difference inputs 23 and 24. Summer 21 combines the VCO ramp and the non-inverting (sum) input from terminal 23. Summer 22 combines the error input from terminal 17 with the inverting (difference) input at terminal 24. FIG. 4 shows the basic waveforms of the FIG. 3 circuit. It can be seen that as the error voltage rises the output pulse will narrow. The ramp waveform will be of constant amplitude but its level, as sensed at the comparator 18 non-inverting input, will be determined by the potential at terminal 23. As the ramp level is raised it can be seen that the output pulse width will be widened. Thus the output pulse width is proportional to the non-inverting input.

The inverting potential at terminal 24 will raise and lower the error voltage applied to the comparator 18 inverting input. Thus, as this potential is raised, the pulse width will narrow. This means that the sense of the sum/difference action can be selected as desired without resorting to an inverting buffer.

FIG. 5 is a schematic diagram of a summing circuit, suitable for IC construction, that can be used to accomplish the function of block 20 of FIG. 3. Summer 21 is accomplished by the current mode combination of the outputs of transistors 25 and 26 in resistor 27. Summer 22 is accomplished by the current mode combination of the outputs of transistors 28 and 29 in resistor 30. The four transistors 25, 26, 28 and 29 are provided with four current sinks 31–34. Resistors 35–38 degenerate and linearize the currents in the emitters of the four transistors. Resistor 39 differentially interconnects transistors 25 and 28 while resistor 40 differentially interconnects transistors 26 and 29. Resistors 41 and 42 return the bases of transistors 26 and 29 respectively to a bias voltage source 43.

The voltages at input terminals 17, 24, 13 and 23 respectively bias transistors 25, 26, 28 and 29. Since load resistors 27 and 30 sum the transistor currents, the comparator inputs are voltage replicas of the input terminal voltages. Resistor 39 forces transistors 25 and 28 to operate differentially so that the error and ramp voltages are compared differentially. Resistor 40 forces transistors 26 and 29 to operate differentially so that the sum/difference inputs operate in a differential manner also. In the absence of any sum/difference signals terminals 23 and 24 will be at the level of voltage source 43.

The invention has been shown and a preferred embodiment detailed for use with integrated circuitry. When a person skilled in the art reads the foregoing description, alternatives and equivalents, within the spirit and intent of the invention, will become apparent. Accordingly, it is intended that the scope of the invention be determined only by the following claims.

We claim:

1. A circuit for signal summing useful in pulse width modulators, said circuit comprising:

first and second power supply terminals connectable to a source of operating power;

a first transistor having a base coupled to a first signal voltage source, an emitter coupled to one terminal of a first scaling and linearizing resistor, and a collector coupled to one terminal of a first load element;

a second transistor having a base coupled to a second voltage signal source, an emitter coupled to one terminal of a second scaling and linearizing resistor, and a collector coupled to one terminal of a second load element;

means for coupling the other terminals of said first and second load elements to said first power supply terminal;

means for coupling the other terminals of said first and second scaling and linearizing resistors respectively through first and second constant current devices to said second power supply terminal;

a third transistor having a collector coupled to said collector of said first transistor, an emitter coupled to one terminal of a third scaling and linearizing resistor, and a base coupled to a third voltage signal source;

a fourth transistor having a collector coupled to said collector of said second transistor, an emitter coupled to one terminal of a fourth scaling and linearizing resistor, and a base coupled to a fourth voltage signal source;

means for coupling the other terminals of said third and fourth scaling and linearizing resistors respectively through third and fourth constant current devices to said second power supply terminal whereby said first and third voltage signal sources are summed in said first load element and said second and fourth voltage signal sources are summed in said second load element.

2. The circuit of claim 1 further comprising:

a first coupling resistor coupled between said other ends of said first and second linearizing resistors; and a second coupling resistor coupled between said other ends of said third and fourth linearizing resistors whereby said first and second voltage signal sources are combined differentially and said third and fourth voltage signal sources are combined differentially.

* * * * *